United States Patent
Sun et al.

(10) Patent No.: US 11,988,789 B2
(45) Date of Patent: May 21, 2024

(54) METHOD FOR HYDROCARBON PROSPECTING USING AN APPROXIMATED INVERSE HESSIAN TO UPDATE A PROPERTY MODEL

(71) Applicant: ExxonMobil Technology and Engineering Company, Spring, TX (US)

(72) Inventors: Junzhe Sun, San Jose, CA (US); Valeriy V. Brytik, Houston, TX (US); Lingxiao Zhang, Sugar Land, TX (US); Erik R. Neumann, Houston, TX (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 751 days.

(21) Appl. No.: 17/247,503

(22) Filed: Dec. 14, 2020

(65) Prior Publication Data
US 2021/0223425 A1    Jul. 22, 2021

Related U.S. Application Data

(60) Provisional application No. 62/962,572, filed on Jan. 17, 2020.

(51) Int. Cl.
*G01V 1/28*    (2006.01)
*G01V 1/36*    (2006.01)
*G06F 30/20*    (2020.01)

(52) U.S. Cl.
CPC .............. *G01V 1/282* (2013.01); *G01V 1/362* (2013.01); *G06F 30/20* (2020.01)

(58) Field of Classification Search
CPC ......... G01V 1/282; G01V 1/362; G06F 30/20
See application file for complete search history.

(56) References Cited

U.S. PATENT DOCUMENTS 9,176,930 B2 *  11/2015  Lee ........................ G01V 1/282
9,482,770 B2    11/2016  Sun
(Continued)

OTHER PUBLICATIONS

Gian Matharu, Mauricio D Sacchi, Source encoding in multiparameter full waveform inversion, Geophysical Journal International, vol. 214, Issue 2, Aug. 2018, pp. 792-810, https://doi.org/10.1093/gji/ggy157 (Year: 2018).*

(Continued)

*Primary Examiner* — Eunhee Kim
(74) *Attorney, Agent, or Firm* — ExxonMobil Technology and Engineering Company—Law Department

(57) ABSTRACT

A method for approximating an inverse Hessian is provided. One methodology to generate the inverse Hessian is to precondition the gradient, such as by using point-spread function deconvolution, T-power, or source-illumination compensation, prior to using non-stationary matching filters (NMF) to generate the inverse Hessian. Various types of NMF are contemplated, including using filters for different windows in the subsurface or using filters assigned to specific locations in the subsurface. Further, the number of filters for NMF may vary from iteration to iteration. For example, the filters assigned to the specific locations in the subsurface may be generated in a multi-scale manner, in which an initial iteration uses longer scale/longer wavelength features for inversion and subsequent iterations use finer scale/smaller wavelength features for inversion.

20 Claims, 10 Drawing Sheets

(56) References Cited

U.S. PATENT DOCUMENTS

| | | | |
|---|---|---|---|
| 10,386,511 B2 | 8/2019 | Routh et al. | |
| 2010/0278413 A1* | 11/2010 | Jarisch | G06F 18/00 |
| | | | 382/131 |
| 2013/0138408 A1* | 5/2013 | Lee | G01V 1/282 |
| | | | 703/2 |
| 2015/0073755 A1* | 3/2015 | Tang | G06F 30/20 |
| | | | 703/2 |
| 2017/0123090 A1* | 5/2017 | Khalil | G01V 1/364 |
| 2017/0176613 A1 | 6/2017 | Burnett et al. | |

OTHER PUBLICATIONS

Shearer, Paul R. "Separable Inverse Problems, Blind Deconvolution, and Stray Light Correction for Extreme Ultraviolet Solar Images." PhD diss., 2013. (Year: 2013).*

Aoki, N., & Schuster, G. T. (2009) "Fast least-squares migration with a deblurring filter", Geophysics, vol. 74, Issue 6, pp. WCA83-WCA93.

Fletcher, R. P. et al. (2016) "Least-squares migration—Data domain versus image domain using point spread functions", The Leading Edge, vol. 35, Issue 2, pp. 157-162.

Fomel, S. (2007) "Shaping regularization in geophysical-estimation problems", Geophysics, vol. 72, Issue 2, pp. R29-R36.

Fomel, S. (2009) "Adaptive multiple subtraction using regularized nonstationary regression," Geophysics, vol. 74, Issue 1, pp. V25-V33.

Guitton, A. (2004) "Amplitude and kinematic corrections of migrated images for nonunitary imaging operators", Geophysics, vol. 69, Issue 4, pp. 1017-1024.

Guitton, A. (2017) "Fast 3D least-squares RTM by preconditioning with nonstationary matching filters", In SEG Technical Program Expanded Abstracts, pp. 4395-4399.

Rickett, J. E. (2003) "Illumination-based normalization for wave-equation depth migration", Geophysics, vol. 68, Issue 4, pp. 1371-1379.

Symes, W. W. (2008) "Approximate linearized inversion by optimal scaling of prestack depth migration", Geophysics, vol. 73, Issue 2, pp. R23-R35.

Tarantola, A. (2005) "Inverse problem theory and methods for model parameter estimation", Chapter 3.4 (3.4.2-3.4.4), vol. 89, SIAM, pp. 76-79.

Wang, P. et al. (2016) "Least-squares RTM: Reality and possibilities for subsalt imaging", In SEG Technical Program Expanded Abstracts, pp. 4204-4209.

Wang, M. et al. (2017) "Improved iterative least-squares migration using curvelet-domain Hessian filters", In SEG Technical Program Expanded Abstracts, pp. 4555-4560.

* cited by examiner

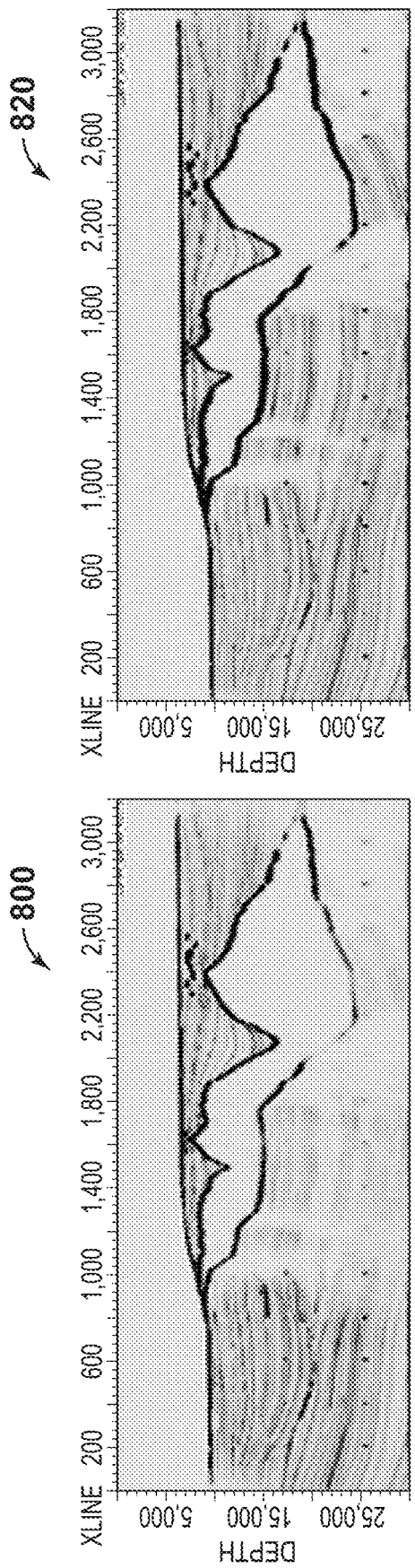
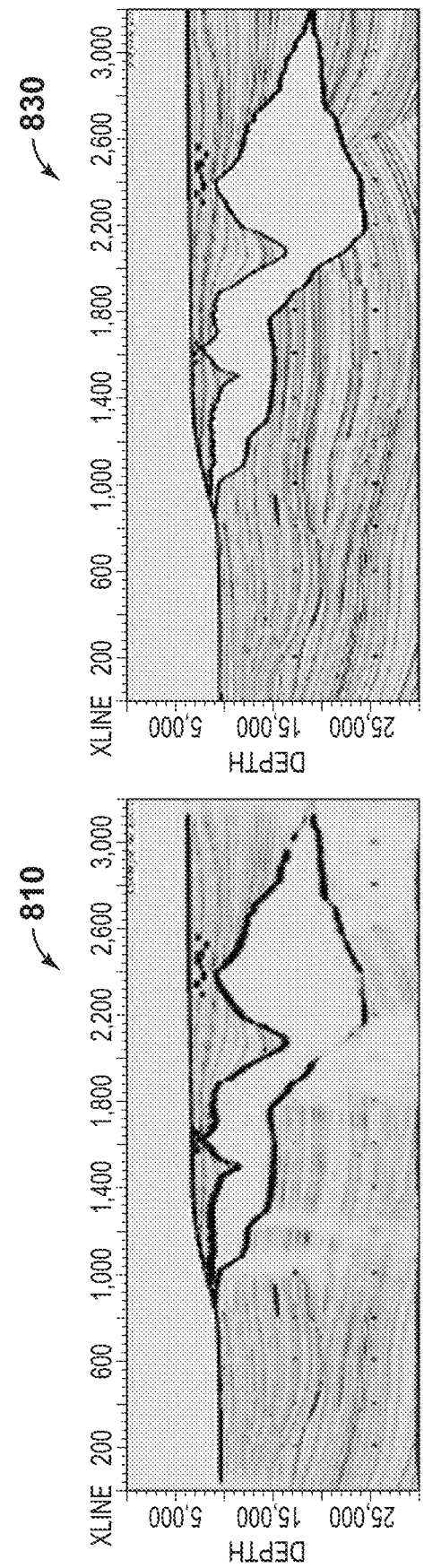
FIG. 8A
FIG. 8B
FIG. 8C
FIG. 8D

METHOD FOR HYDROCARBON PROSPECTING USING AN APPROXIMATED INVERSE HESSIAN TO UPDATE A PROPERTY MODEL

CROSS REFERENCE TO RELATED APPLICATION

This application claims the benefit of priority of U.S. Provisional Application No. 62/962,572, filed Jan. 17, 2020, the disclosure of which is incorporated herein by reference in its entirety.

TECHNICAL FIELD

The technical field relates to geophysical prospecting, such as geophysical data processing used for prospecting. More specifically, the technical field relates to a method for approximating an inverse Hessian for seismic imaging.

BACKGROUND

Seismic imaging refers to the task of inferring the subsurface model properties of the Earth based on surface observations of seismic waves. The seismic data recorded on the surface is the Earth's response to a certain source function, which may comprise a controlled seismic source of energy for use in exploration seismology, including the prospecting for or production of hydrocarbons. Conventional seismic imaging algorithms, such as Kirchhoff migration, wave-equation migration and reverse-time migration, produce structural images of the subsurface given an estimated velocity model. Inversion-based seismic imaging algorithms, also known as waveform inversion, iteratively update the subsurface model property to reduce data misfit defined by a certain objective function (e.g., a cost function). The model updates are computed by the back-projection of data residual into the model domain. The mapping between model and data spaces is usually achieved by computationally intensive ray-based or wave-equation-based methods. When seismic data is linearly dependent on the model parameter, the inversion is known as linearized waveform inversion, or least-squares migration.

In the case of impedance inversion with an $L_2$ objective function, which is a linearized inversion problem, the objective function may be defined as:

$$\min_{m} \|Lm - d\|_2, \quad (1)$$

where L is the forward modeling operator, m is the impedance model, and d is the observed seismic data (or other type of measured geophysical data). The least-squares solution to the problem defined in equation (1) may be expressed as:

$$m = (L^T L)^{-1} L^T d, \quad (2)$$

where $L^T$ is the migration operator, $L^T d$ is the gradient, or the seismic image, and $L^T L$ is also known as the Hessian matrix. An efficient local approximation to the inverse Hessian may therefore significantly reduce the number of iterations to achieve convergence, or in the case of simple environments, obtain high-fidelity amplitude images within a single iteration. In this regard, computing the inverse Hessian may assist in seismic imaging.

SUMMARY

In one implementation, a computer-implemented method for inverting measured geophysical data in order to generate a subsurface property model of one or more physical properties is disclosed. The method includes: computing, using at least one computer and a subsurface property model, an objective function measuring misfit between model-simulated data and the measured geophysical data; computing, using the at least one computer, a gradient of the objective function with respect to parameters of the subsurface property model; preconditioning, using the at least one computer, the gradient; approximating, using non-stationary matching filters, an inverse Hessian of the subsurface property model; computing a search direction using the inverse Hessian and the preconditioned gradient; updating the subsurface property model using the search direction; and analyzing the updated subsurface property model for convergence.

In another implementation, a computer-implemented method for inverting measured geophysical data in order to generate a subsurface property model of one or more physical properties is disclosed. The method includes: computing, using at least one computer and a subsurface property model, an objective function measuring misfit between model-simulated data and the measured geophysical data; computing, using the at least one computer, a gradient of the objective function with respect to parameters of the subsurface property model; approximating, using non-stationary matching filters with longer-scale features and the gradient, an inverse Hessian of the subsurface property model; computing a search direction using the inverse Hessian and the gradient; updating the subsurface property model using the search direction; analyzing the updated subsurface property model for convergence; and responsive to determining that the updated subsurface property model has not converged, iterating using non-stationary matching filters with progressively finer-scale features.

In another implementation, a computer-implemented method for inferring a model of velocity or other physical property by iteratively inverting measured seismic data is disclosed. The method includes: computing, using at least one computer and a subsurface property model, an objective function measuring misfit between model-simulated data and the measured geophysical data; computing, using the at least one computer, a gradient of the objective function with respect to parameters of the subsurface property model; approximating, using regularized non-stationary regression, an inverse Hessian of the subsurface property model; computing a search direction using the inverse Hessian and the gradient; updating the subsurface property model using the search direction; and analyzing the updated subsurface property model for convergence.

DESCRIPTION OF THE FIGURES

The present application is further described in the detailed description which follows, in reference to the noted plurality of drawings by way of non-limiting examples of exemplary implementation, in which like reference numerals represent similar parts throughout the several views of the drawings.

FIGS. 8A-D illustrate comparisons of the first iteration result of LS-RTM comparisons using T-power as a preconditioner (FIG. 8A), using PSF as a preconditioner (FIG. 8B), and using NMF as a preconditioner (FIG. 8C) for the same area as illustrated in FIG. 6. FIG. 8D illustrates the true zero-offset reflectivity model corresponding to the Sigsbee velocity model.

DETAILED DESCRIPTION

Figure 1:
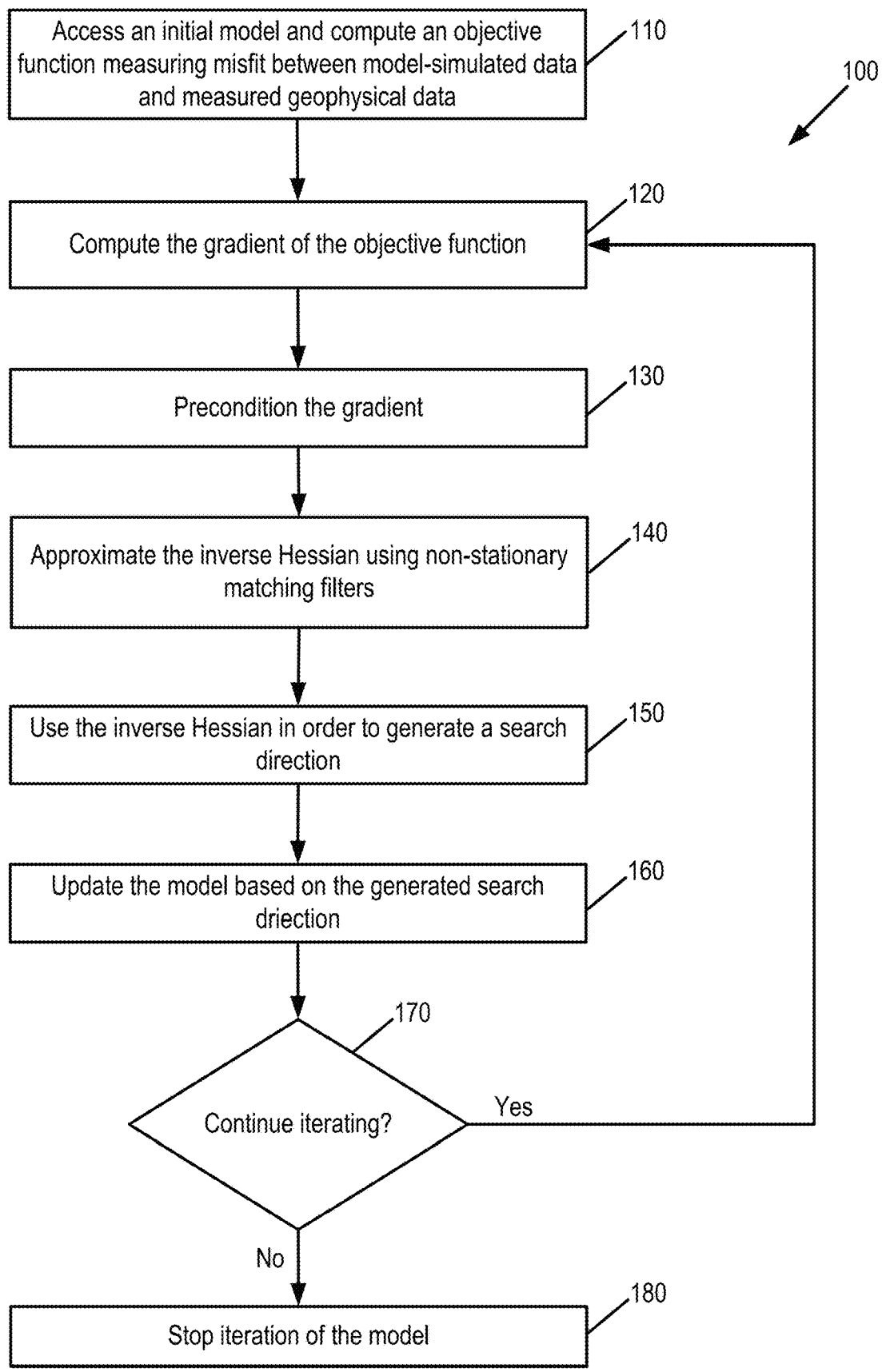
FIG. 1 illustrates a first example flow diagram of preconditioning the gradient and approximating an inverse Hessian using non-stationary matching filters in order to perform iterative inversion.

The methods, devices, systems, and other features discussed below may be embodied in a number of different forms. Not all of the depicted components may be required, however, and some implementations may include additional, different, or fewer components from those expressly described in this disclosure. Variations in the arrangement and type of the components may be made without departing from the spirit or scope of the claims as set forth herein. Further, variations in the processes described, including the addition, deletion, or rearranging and order of logical operations, may be made without departing from the spirit or scope of the claims as set forth herein.

As discussed in the background, approximating the inverse Hessian may assist in seismic imaging. For example, a goal of iterative least-squares inversion is to estimate the application of inverse Hessian to a given input vector. Alternatively, band-limited Hessian and its inverse may be approximated in the model/image domain. Further, though the examples discussed below are directed to linearized inversion (such as least-squares inversion), non-linearized inversion (such as full wavefield inversion) is also contemplated for other properties (e.g., velocity, anisotropic parameters, density, etc.).

Approximation of the inverse Hessian may be performed using a variety of approaches. Two approaches are point-spread functions (PSF) and non-stationary matching filters (NMF). PSF is generated by performing forward modeling using point diffractors, followed by migration with a certain imaging condition. The modeling operator is linearized with regard to model perturbation, and the migration is the adjoint operator of modeling. PSF may be viewed as the impulse responses of the Hessian matrix at sparsely sampled spatial locations. The PSF volume may be utilized for different purposes. For example, image-domain inversion may be achieved by deconvolving PSF from a given migration image. Instead of the single-iteration approach used in image-domain inversion, PSF-deconvolution may also be used as a model-domain preconditioner to accelerate the convergence rate of linear and non-linear waveform inversions. An example of this is illustrated in US Patent Application Publication No. 2015/0073755 A1, incorporated by reference herein in its entirety. Further, PSF may be used as a tool for geophysical survey design, such as illustrated in US Patent Application Publication No. 2017/0176613 A1, incorporated by reference herein in its entirety.

NMF, on the other hand, performs the de-migration and migration round-trip using a reference image, which may be achieved with a preliminary migration. Instead of computing entries of the Hessian matrix, NMF directly approximates the band-limited inverse-Hessian matrix by matching the secondary migration image to the reference image through iterative inversion. Various types of NMF are contemplated whereby filters, which vary in space, are used.

In one implementation, NMF uses window-based filters. In particular, to account for non-stationarity of the inverse-Hessian matrix, filter coefficients may be estimated in a sliding, local window with overlapping regions that satisfy the partition of unity, processing also known as patch-processing (e.g., the values of the filters for the different windows vary or are non-stationary from one window to the next, with the values for the filters potentially being interpolated). Alternatively, in a point-based approach (e.g., a non-sliding window approach), interpolation may be performed directly on the filter coefficients to obtain different filters at different respective locations (e.g., the values of the filters vary or are non-stationary from one location to the next, with the values for the filters potentially being interpolated). Non-stationary matching may be performed directly on an image, or may be performed in a transformed domain, such as for example, using curvelet transforms.

Similar to the PSF approach, NMF may be used for either image-domain inversion, or as a model-domain preconditioner for data-domain iterative inversion. In particular, the generalized inverse-Hessian filter may be applied in both image-domain inversion and data-domain iterative inversion. However, the discussion herein does not differentiate between image-domain and data-domain formulations because the so-called image-domain inversion simply corresponds to the first iteration of the data-domain iterative inversion. Therefore, the methodology disclosed comprises a generalized inverse-Hessian filter as a model-domain preconditioner in an iterative inversion framework driven by data misfit. In this regard, any discussion herein regarding inversion in the model domain may likewise be applied to the data domain.

PSF and NMF are markedly different in their respective approaches to approximating the Hessian or its inverse, and also suffer from different drawbacks. For example, PSF deconvolution has uniform sensitivity across the entire model due to the uniform distribution of point diffractors, which may thereby normalize sensitivity across the entire subsurface property model. This enables updates in poorly illuminated areas due to acquisition geometry and transmission loss. Additionally, since PSF captures the full Hessian at discrete points, PSF deconvolution may efficiently broaden the seismic image bandwidth. However, PSF may also be prone to noise amplification. In this regard, one or more steps may be taken to reduce the effect of noise amplification. In contrast, NMF estimates the band-limited inverse Hessian local to a reference image, and therefore has its sensitivity limited by reflector distribution. The continuous sampling along reflectors, however, ensures a stable inversion process of NMF estimation. Therefore, NMF may be an effective tool for artifact removal and amplitude balancing in relatively simple illumination settings.

In one implementation, a preconditioning step (such as preconditioning the gradient) is performed prior to using NMF to approximate the Hessian. Preconditioning may be paired with various types of NMF. As one example, the preconditioned gradient may be paired with traditional NMF, such as disclosed in any one of: Rickett, J. E., Illumination-based normalization for wave-equation depth migration, Geophysics, 68(4), 1371-1379 (2003); Guitton, A., Amplitude and kinematic corrections of migrated images for nonunitary imaging operators, Geophysics, 69(4), 1017-1024 (2004); Aoki, N., & Schuster, G. T., Fast least-squares migration with a deblurring filter, Geophysics, 74(6), WCA83-WCA93 (2009). In particular, filter coefficients may be estimated in a sliding, local window with overlapping regions that satisfy the partition of unity. Alternatively, a non-window or point-based NMF approach may be used whereby filters are assigned to specific locations in the subsurface. In particular, the preconditioned gradient may be paired with non-stationary regression, such as using multi-scale regularized non-stationary regression, discussed further below, or regularized non-stationary regression, discussed in Fomel, S., Adaptive multiple subtraction using regularized nonstationary regression, Geophysics, 74(1), V25-V33) (2009). In regularized non-stationary regression, the NMF coefficients may be inverted as a whole with shaping regularization, whereby interpolation is performed directly on the filter coefficients to obtain non-stationary filters at a given location if the filter coefficients are subsampled in space compared with the input gradient vector.

Further, various types of preconditioning are contemplated. Examples of preconditioners include, without limitation: T-power; source-illumination compensation; or PSF deconvolution. Other preconditioners are contemplated. The preconditioner may differentiate from NMF in one or more ways including any one, any combination, or all of:

(1) normalizing sensitivity across a larger portion of the subsurface property model than applied during NMF. For example, the sensitivity normalization during preconditioning may be larger than the windows used in a windows-based NMF approach or larger than the subsurface points used in a point-based NMF approach, such as multi-scale regularized non-stationary regression. In one implementation, the preconditioning may apply the uniform sensitivity across the entire subsurface property model by introducing evenly spaced uniform point diffractors;

(2) introducing one or more errors (such as due to imprecision in preconditioning (e.g., using T-Power) and/or due to interpolation errors) that are reduced or minimized by the later-applied NMF; or (3) resulting in any one, any combination, or all of: bandwidth broadening; regularization; or illumination compensation, with the later-applied NMF resulting in at least one (or both) of: artifact removal and additional enhancements to preconditioned gradients. Additional enhancement(s) may include, but are not limited to, any one, any combination, or all of: bandwidth broadening; regularization; or illumination compensation.

In another implementation, non-stationary regression, such as regularized non-stationary regression, may be used to approximate the inverse Hessian. Regularized non-stationary regression does not employ patch processing; instead, the entire model or sub-model may be estimated in a single inversion task. By introducing non-stationarity, the filter coefficients become a variable of space, and the problem is highly underdetermined. The regularization, also known as shaping regularization, may be performed using a smoothing operator, which guarantees the filter coefficients vary smoothly in space. The smoothing operator can be applied along structural dips to enforce conformity to geological features. Further, one may also gradually reduce the smoothing radius to improve the fitting locally.

Non-stationary regression may be implemented in one of several ways. In one way, a multi-scale approach may be used in order to generate the filters used for non-stationary regression. As discussed above, filters may be assigned to stationary points in the space assigned to the subsurface. Unfortunately, assigning filters to each point in space results in the number of filter coefficients exploding in 3D applications, not to mention in higher dimensions. In this regard, filters assigned to each point in the subsurface space may be computationally too expensive. Thus, in one implementation, the filters may be assigned to fewer than all of the points in the subsurface space. For example, in a subsurface space with $10^9$ defined points, non-stationary regression may be performed with filters that are assigned to a fraction of defined points in the subsurface space, such as one-tenth (resulting in $10^8$ filters) or one-hundredth (resulting in $10^7$ filters). The filters may be assigned to discrete spatial locations or points in a grid at a predetermined scale (e.g., for a fraction of one-tenth (or a scale of every 10), focusing solely in the x-direction, filters are assigned to every $10^{th}$ point, such as point 0, point 10, point 20, etc.; the filters may likewise be scaled in 3-D space). In this way, the non-stationary regression process may be performed at a lower storage (e.g., memory) requirement.

Further, in a specific implementation, the number of filters and the strength of regularization for inversion may vary between iterations resulting in the multi-scale approach. For example, between iterations (such as between successive iterations), the fraction or scale may change. In particular, in a first iteration, larger scale/longer wavelength features and stronger smoothness constraint (e.g., a longer smoothing radius), such as every tenth point, may be used for inversion, and in a subsequent iteration (such as the next iteration or a later iteration), finer scale/smaller wavelength features, such as every fifth point, may be used for inversion. In this way, the scale of features for non-stationary regression may change for different iterations (e.g., larger scale/longer wavelength features are inverted; thereafter, finer scale/smaller wavelength features may be used for subsequent inversions).

In practice, in one iteration, non-stationary filters may be defined on a sparsely sampled space. In a subsequent iteration, one may obtain non-stationary filters on a denser-sampled space via interpolation, resulting in smoothly varying filter coefficients. This multi-scale approach may significantly alleviate the storage requirement of the non-stationary filters, and convergence may become more rapid because of the reduced number of model parameters. Additionally, since the interpolated results are already smooth, regularization by smoothing may be less aggressive, which in turn reduces the computational cost further. After convergence is reached using a coarse sampling rate for the non-stationary filter, one may interpolate it onto a denser grid and use it as the starting model to invert for more local features with higher resolution. Thus, using the multi-scale approach, inversion may be performed in a stable and efficient manner, rendering the multi-scale approach suitable for practical applications.

Referring to the figures, FIG. 1 illustrates a first example flow diagram 100 of preconditioning the gradient and approximating an inverse Hessian using non-stationary matching filters in order to perform iterative inversion. Thus, prior to preconditioning, at 110, an initial model is accessed and an objective function measuring misfit between model-simulated data and measured geophysical data is computed. Further, at 120, the gradient is computed of the objective function. At 130, the gradient is preconditioned.

Figure 3:
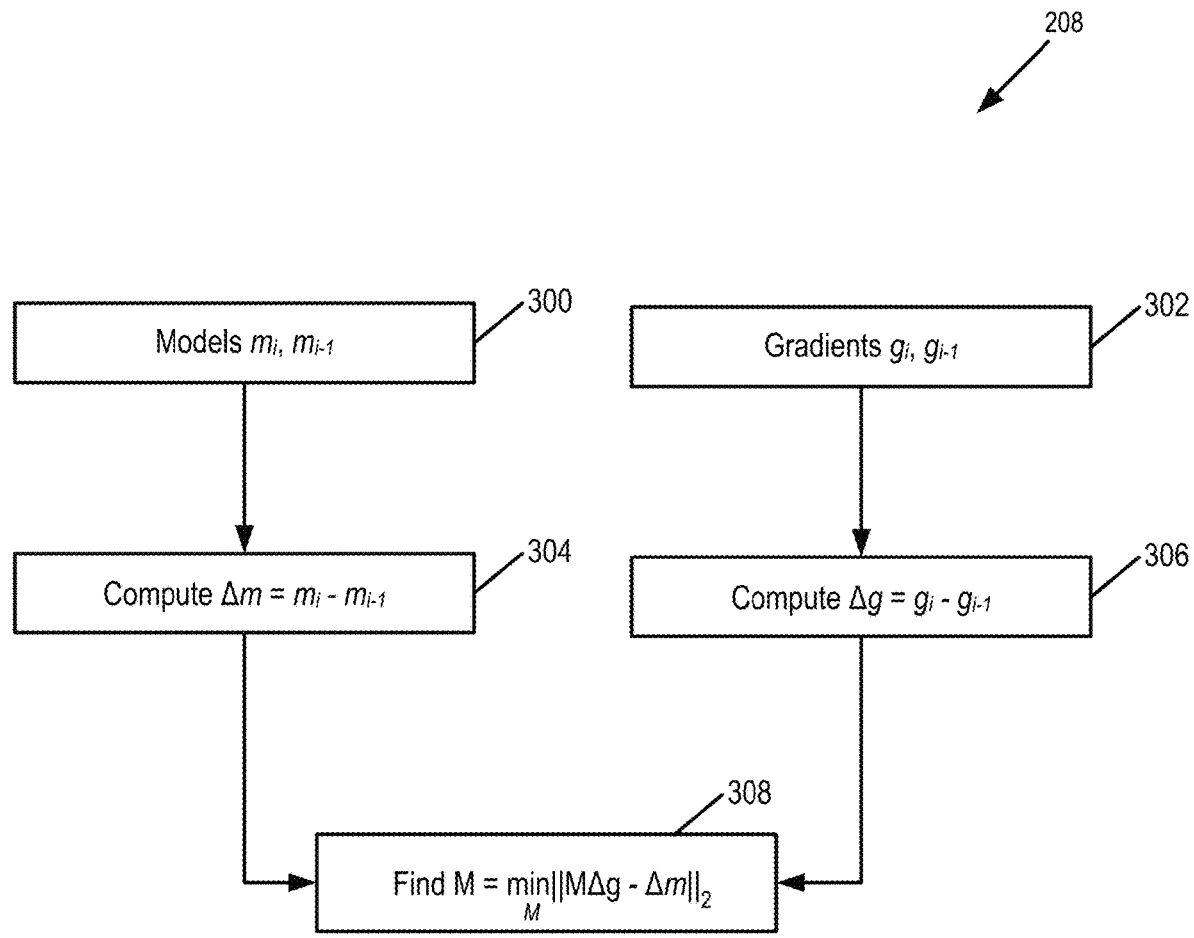
FIG. 3 illustrates a flow diagram for approximating the inverse Hessian.

In order to correct for the residual Hessian, at 140, NMF is used to provide a stable estimation of its inverse by minimizing the objective function, as discussed further with regard to FIG. 3. One example of NMF is non-stationary regression.

At 150, the inverse Hessian is used in order to generate a search direction. At 160, the search direction is used to update the model. For example, the search direction may be used in order to perform a line search to update the model, as discussed further with regard to FIG. 2. Thus, in effect, FIG. 1 illustrates an initial preconditioning step at 130 and thereafter another preconditioning step at 140.

At 170, it is determined whether to continue iterating. As one example, iteration continues if the updated model has not sufficiently converged (e.g., the data generated from the updated model is significantly different from the actual data). If so, flow diagram 100 loops back to 120. If not, at 180, iteration of the model is stopped.

The methodology, such as disclosed in flow diagram 100, may be performed for an entire subsurface of interest. Alternatively, the subsurface of interest may be divided into a plurality of volumes (such as a plurality of overlapping volumes). For example, a 1000×1000×1000 volume may be divided into eight overlapping volumes of 600×600×600. The methodology, such as disclosed in flow diagram 100, may be performed on each of the plurality of volumes. After which, interpolation in the overlapping regions may be performed in order to form an entire image of the subsurface of interest. Thus, in instances where a single model is not computed by the computer, patch processing may be performed.

Figure 2:
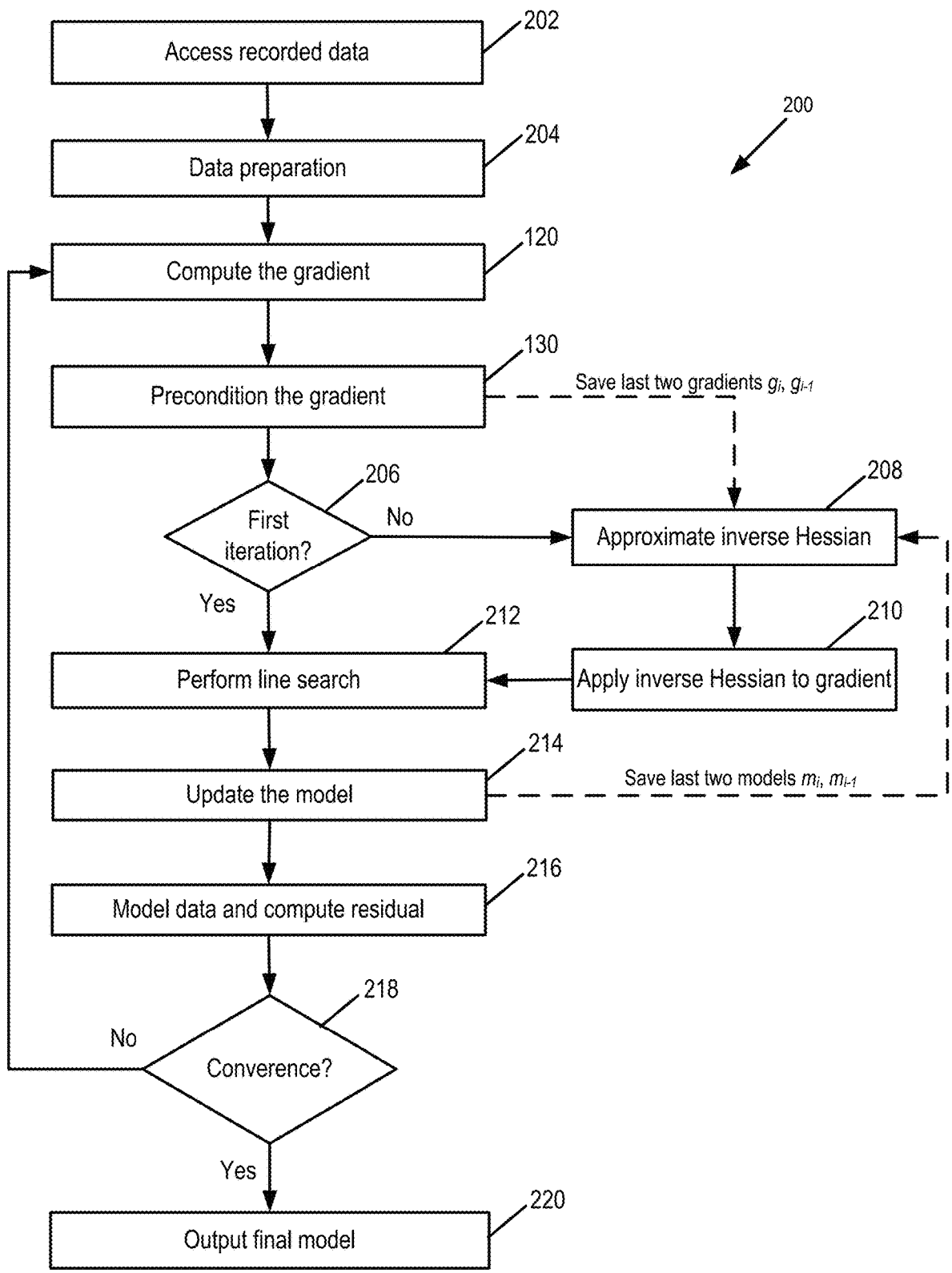
FIG. 2 illustrates a second example flow diagram of preconditioning the gradient and approximating an inverse Hessian using non-stationary matching filters in order to perform iterative inversion.

FIG. 2 illustrates a second example flow diagram 200 of preconditioning the gradient and approximating an inverse Hessian using non-stationary matching filters in order to perform iterative inversion. Specifically, FIG. 2 illustrates a process of generating an inverse Hessian approximation in an iterative framework in which the inverse Hessian approximation is updated after each iteration (except for the first iteration).

At 202, recorded data is accessed. As discussed above, seismic data may be recorded in order to generate the model. At 204, data preparation may optionally be performed. As discussed above, the gradient may be computed (at 120) and the gradient may be preconditioned (at 130).

As discussed above, NMF uses a reference image. As such, at 206, it is determined whether this is the first iteration. If not, at 208, the inverse Hessian is approximated, which is discussed in further detail with regard to FIG. 3. After which, at 210, the inverse Hessian is applied to the gradient. Flow diagram 200 then loops to 212. If it is the first iteration, flow diagram 200 goes directly to 212 in order to perform a line search (e.g., estimating an optimal scaler for scaling the preconditioned gradient), and at 214, the model is updated. As discussed with regard to FIG. 3, the last two gradients $g_i$, $g_{i-1}$ and the last two models $m_i$, $m_{i-1}$ are saved in order to approximate the inverse Hessian at 208. Alternatively, instead of re-computing NMF coefficients for each iteration, the NMF coefficients computed from the first two gradients can be saved and used for all later iterations.

At 216, the model data may be simulated and the residual between the simulated model data and the actual seismic data is computed. At 218, convergence is determined using the residual (e.g., based on a difference between the simulated model data and the actual seismic data). If it is determined that the model has not converged, flow diagram 200 loops back to 120. If so, at 220, the final model is output.

Thus, FIG. 2 illustrates a flow diagram 200 for approximating the inverse wave-equation Hessian matrix, such as by its main diagonal and a few off-diagonals, using NMF (such as regularized non-stationary regression). The methodology may provide a secondary correction to the Hessian matrix after a certain preconditioner is applied. For example, when the preconditioner is PSF-deconvolution, the methodology may effectively combine the advantages of PSF-deconvolution (e.g., bandwidth broadening, regularization and illumination compensation) with the advantages of non-stationary matching filters (e.g., artifact removal and additional enhancements to preconditioned gradients). In geologically complex areas, such as subsalt areas with complex salt geometry, the methodology may provide critical uplift to image quality, which may not be achieved by either the PSF-deconvolution or standalone NMF estimation.

Thus, when PSF-deconvolution is selected as preconditioning operator, the following workflow may be used:
1. Given the frequency range of the target image, point diffractors may be designed with a spacing that minimizes cross-talk noise while providing sufficient sampling to represent the variations in the model.
2. Using the point diffractors as input, perform the demigration-migration round-trip and necessary post-migration processing to generate the PSF volume.
3. Perform two iterations of LSRTM, with PSF-deconvolution applied to the gradients before each line search.
4. Construct the gradient change by taking the difference between the preconditioned gradient of two iterations.
5. Construct the model update by taking the difference between the images of two iterations.
6. Estimate the inverse residual Hessian by matching the gradient change to model update.
7. Apply the estimated filter to preconditioned gradients to correct residual Hessian effects.

Further, various types of NMF may be paired with the preconditioner. FIG. 3 illustrates one example, disclosing a flow diagram of block 208 for approximating the inverse Hessian. As discussed above, an inverse-Hessian approximation approach is disclosed in which a stable estimation of the residual Hessian is generated after the application of a preconditioning operator, using NMF (such as regularized non-stationary regression). To provide a formal definition of the residual Hessian in the case of least-squares inversion of the aforementioned linear operator L, the gradient at $i^{th}$ iteration may be expressed as:

$$g_i = PL^T(Lm_i - d), \qquad (3)$$

where P is a model-domain preconditioning operator. There is no underlying assumption of the optimization scheme of choice; however, a given model update $\Delta m$ is assumed. In the simplest case of steepest descent, $\Delta m = -\alpha g_i$, where $\alpha$ is the step length obtained by a line search algorithm. The gradient at the next iteration may be expressed as:

$$g_{i+1} = PL^T(Lm_{i+1} - d) = PL^T(L(m_i + \Delta m) - d) \qquad (4)$$

The Hessian is related to the rate of change of the gradient, and the gradient change $\Delta g$ may be obtained by taking the difference between the last two gradients:

$$\Delta g = g_i - g_{i-1} = PL^T L \Delta m = \tilde{H} \Delta m. \qquad (5)$$

Thus, at 302, the last two gradients are accessed and at 306, $\Delta g$ is computed. As shown, the model update $\Delta m$ is linearly dependent on the gradient update $\Delta g$ for the linear inversion set-up. Thus, at 300, the last two models are accessed and at 304, $\Delta m$ is computed. For non-linear inversion, this relationship is still a valid approximation assuming the model update $\Delta m$ is of small-scale. Here, $\tilde{H}=PL^T L$ is the residual Hessian matrix, in order to differentiate from the raw Hessian matrix without the preconditioner P. If matrix P perfectly approximates the inverse Hessian, then the residual Hessian approaches an identity matrix (i.e., there is not much left to be approximated). However, such cases rarely exist for even moderately complex settings.

In the case of Least-square Reverse-time Migration (LSRTM), preconditioners may be used, such as T-power, source-illumination compensation, or PSF deconvolution. These operators are progressively effective in correcting the Hessian effect; however, none of them may be accurate enough in complex settings, such as a subsalt area.

As discussed above, various types of preconditioning are contemplated. Examples include, but are not limited to, T-power; source-illumination compensation; or PSF deconvolution. Of the three preconditioners listed, T-Power is the simplest and most crude. In one implementation, T-Power applies an increasing gain according to at least one aspect, such as time, reasoning that the image decreases in amplitude when traversing deeper into the subsurface due to natural transmission loss, selectivity, geometrical spreading.

At 308, the following is calculated:

$$\min_M \|M \Delta g - \Delta m\|_2 \quad (6)$$

The non-stationary filter M is a forward finite-difference estimation of the inverse residual Hessian at model $m_i$, or a backward finite-difference estimation at model $m_{i+1}$. For a linear inversion, the coefficients in M remain quite stationary; for non-linear inversion, one may expect M to vary more significantly between iterations.

As discussed above, various NMF approaches are contemplated. For example, traditional NMF may be based on a "sliding-window" approach, whereby the filter coefficients are kept constant within each window. The inversion thereby becomes parallel since each window is independent from the rest. However, convergence of each filter is not necessarily synchronized, with stitching of the windows back to the original model size tending to be prone to interpolation error.

One implementation of traditional NMF uses 5 steps according to:

1. An input reflectivity model m is defined, the synthetic data are generated by d=Lm, and are then migrated to obtain $m_{mig}=L^\wedge d$. The input reflectivity model may be obtained by taking the original data, migrating it to get the migration image, and then skeletonizing it to a line model of reflector interfaces. The smooth background velocity model may then be used to compute the travel times needed for L and $L^\wedge$ operators.
2. A nonstationary filter F may be computed such that it approximates $[L^*L]^{-1}$, e.g., $Fm \approx m$. This filter may be found by defining a small window, e.g., about 2-3 traces wide and three wavelengths long. To simplify, let $F^P$ be the filter in the $p^{th}$ window, and has depth-offset dimensions so it may be represented by the 2×3 filter $F^P=[a\ c\ e;\ b\ d\ f]$. The filter coefficients then satisfy:

$$F^P * m^P_{mig} = m^P \quad (7)$$

where the * denotes convolution only in depth (not in offset), $m^P$ is the vector that represents the discrete reflectivity trace centered in the $p^{th}$ window, and $m^P_{mig}$ represents the three migration traces in that window.

3. Knowing that a convolution operation is commutative so that m*F=F*m, this means that the matrix F may be reformed into a vector and the vector $m_{mig}$ may be formulated as a convolution matrix. Therefore, reformulating F as a 6×1 vector and $[m_{mig}]$ as a convolution matrix yields the 6×1 vector $f=[a\ b\ c\ d\ e\ f]^T$ with the normal equations given by:

$$[m^P_{mig}]^\wedge [m^P_{mig}] f^P = [m^P_{mig}]^\wedge m^P, \quad (7)$$

where $[m^P_{mig}]$ is the convolution matrix that contains the coefficients for three migration traces, with each trace being M samples long, and $m^P$ being the vector that contains one reflectivity trace.

4. The filter $f^P$ is found for all the predefined windows by solving equation (7) for all values of the window index p.
5. The above filter may be found for synthetic migration images that closely resemble the actual migration image obtained from field data. These synthetic images may be generated from the same source-receiver configuration as the original field experiment. Therefore the application of these nonstationary filters to the field migration image may comprise a sufficient approximation to the actual inverse Hessian.

Alternatively, the NMF coefficients may be inverted as a whole (see Fomel, S., Adaptive multiple subtraction using regularized nonstationary regression, Geophysics, 74(1), V25-V33 (2009)). In such an implementation, a unique set of filter coefficients may be defined at each spatial location. However, for large real-data applications, the storage requirement may render the approach impractical.

In one implementation, inverse-Hessian filters may be represented by non-stationary matching filters (NMF) with a limited filter length. These NMFs are multi-dimensional convolutional filters in the space-domain. The filter length may depend on the spatial sampling rate and frequency content of the model. Since the filter coefficients are non-stationary, they are variables of the space locations. For example, a unique set of filter coefficients may be defined at some, but fewer than all, spatial locations in the subsurface. As discussed above, in conventional NMF, the construction of non-stationary filters is performed by patch processing, where the filter coefficients are stationary within a small window, while the window slides across the entire model with a certain stride. The overlapping regions calculated by each window are then stitched back to the original size. There are certain limitations associated with this approach. For instance, the convergence of each window cannot be easily synchronized, and the selection of window size and stride size is mostly done by trial and error.

Figure 4:
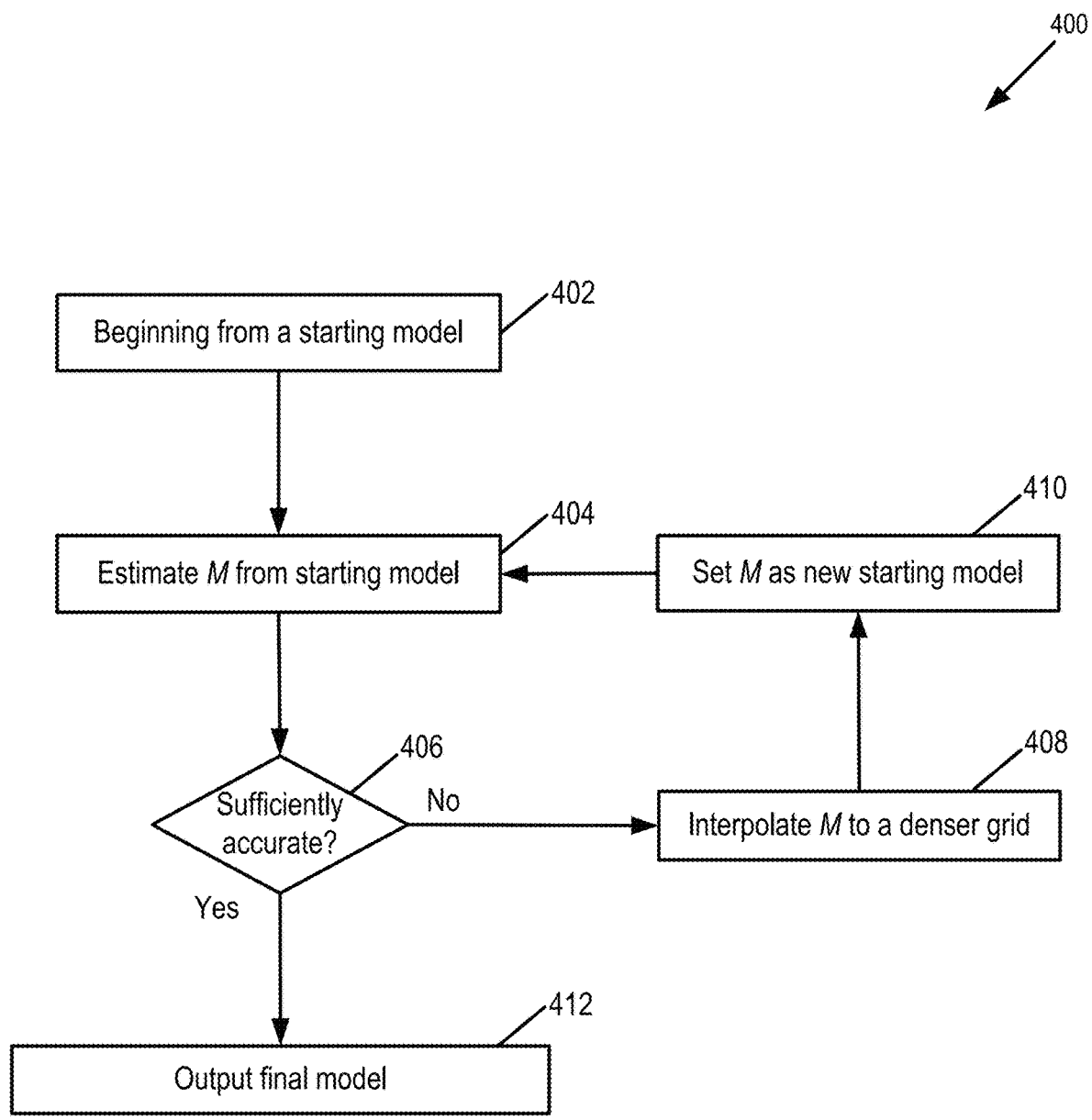
FIG. 4 illustrates a flow diagram for multi-scale inversion of matching filters.

FIG. 4 illustrates a methodology for the representation of the inverse-Hessian filter and for solving for the filter coefficients by minimizing the objective function in equation (6). In particular, FIG. 4 illustrates a flow diagram 400 for multi-scale inversion of matching filters. At 402, the initial step begins from a starting model. At 404, the filters M are estimated from the starting model. In one implementation, NMF as illustrated in block 308 may be used for block 404. As discussed above, filters M may be at defined spatial locations. The interval or scale at which the filters are initially defined may be predetermined, such as at every $10^{th}$, $100^{th}$, etc. location in 3D space (e.g., a predetermined scale of at least every $10^{th}$ location in 3D space, a predetermined scale of at least every $100^{th}$ location in 3D space, etc.). At 406, it is determined whether the filters M are accurate enough. If so, at 412, the final model is output. If not, at 408, the filters M are interpolated to a denser grid, at 410, M is set as the new starting model, and flow diagram 400 loops back to 404. In this way, the scale may be reduced or stepped down (e.g., the next predetermined scale is less than every $10^{th}$ location in 3D space, less than every $100^{th}$ location in 3D space, etc.). Thus, in one implementation, preconditioning, such as PSF-deconvolution, may be paired with the multi-scale NMF approach as illustrated in FIG. 4.

FIG. 4 therefore illustrates that the grid may initially be more coarsely defined, with iteratively further refinements until convergence. For example, the scale of the grid may be progressively decreased, such as beginning at a scale of 10 (e.g., every 10 spatial locations in the grid), and reducing in successive iterations to 5, then to 3, and then to 1. Further, through interpolation, one may ensure that the refined results do not deviate from the coarse results. For example, increasing the density of the grid from 10 to 5 spatial positions, a constraint may be imposed whereby the filters stored in the denser grid do not vary unless it improves the image. In this way, increasing the density of the grid may iteratively refine the coefficients in the denser grid.

Further, one, some, or all of the selection of the initial coarseness of the grid (e.g., initial scale of 10, 20, etc.), the selection of the reduction in scale (e.g., decrease by a certain percentage, or by a certain scale), the selection of the minimum scale may be dynamically determined. For example, for smaller models, the system may store filters at each spatial location. In this regard, the selection of the initial coarseness may be lower (e.g., initial scale selected at 10 instead of 100), the reduction in scale may be greater (e.g., reduction in scale down to 5, to 3, and then to 1), and the minimum scale may be set to 1. Conversely, for larger models which may potentially implicate terabytes of information, storing that many coefficients may be unfeasible. In this instance, for computational efficiency, the system may determine to select the initial coarseness to be greater, the reduction in scale to be lower, and the minimum scale to be higher than 1.

In one implementation, a regularization term may be used in order to maintain certain features from a coarser definition of the grid to a finer definition of the grid. In particular, in addition to the smoothness constraint, another regularization term may penalize deviation of finer scale coefficients from a starting coarser model unless it improves the data fit. In this way, for instances of so-called null spaces, a stronger regularization is in effect such that the NMF coefficients are a smooth continuation of those defined at surrounding locations.

Figure 5:
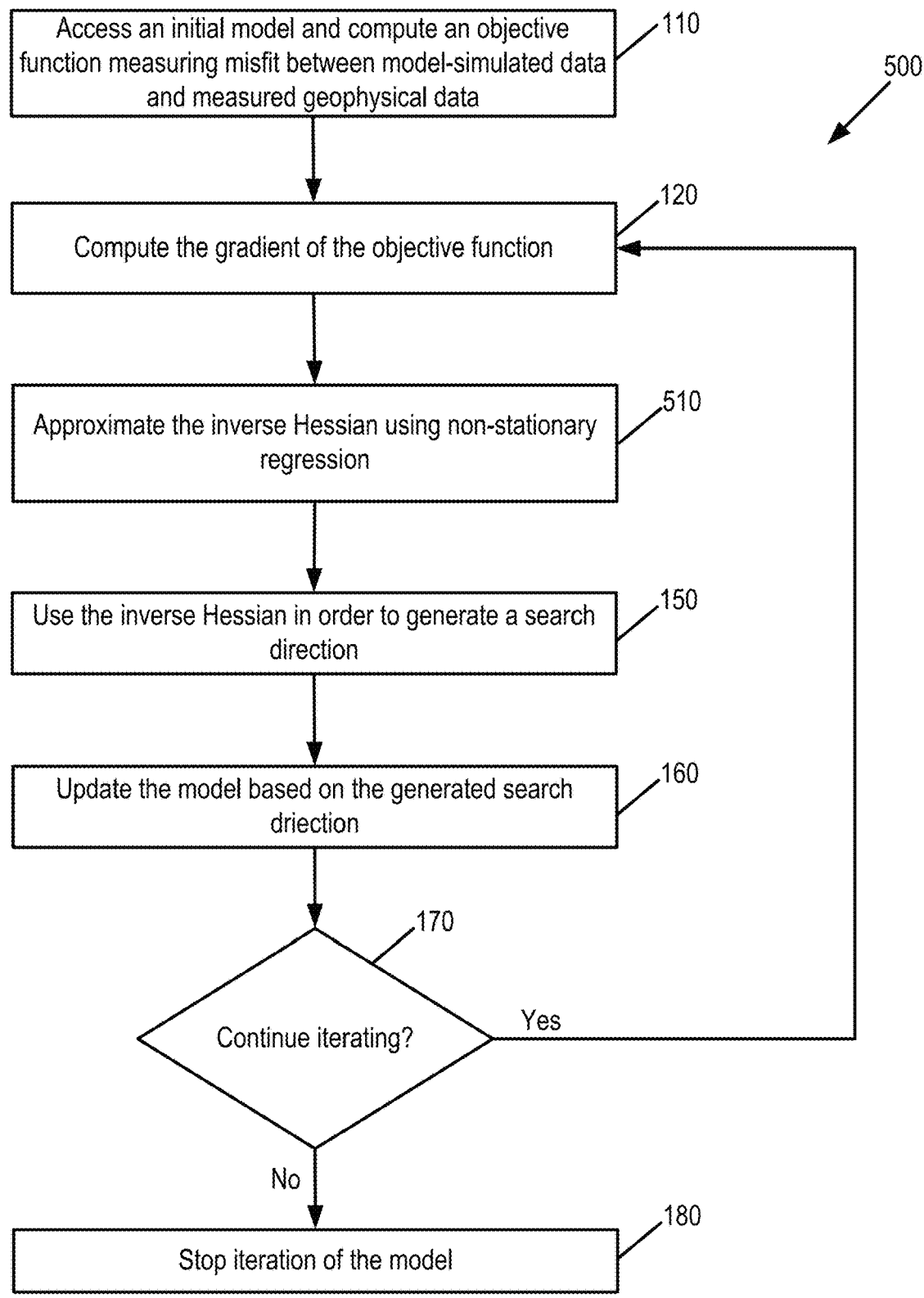
FIG. 5 illustrates a flow diagram of approximating an inverse Hessian using non-stationary regression in order to perform iterative inversion.

FIG. 5 illustrates a flow diagram 500 of approximating an inverse Hessian using non-stationary regression in order to perform iterative inversion. As discussed above, various types of NMF may be used to generate the inverse Hessian. One type comprises non-stationary regression, which may use respective filters assigned to each of the spatial locations in the subsurface, such as discussed in Fomel, S., Adaptive multiple subtraction using regularized nonstationary regression, Geophysics, 74(1), V25-V33) (2009), or may use respective filters assigned to less than all of the spatial locations in the subsurface (e.g., at every $3^{rd}$, $5^{th}$, $10^{th}$, etc.). Thus, at 510, the inverse Hessian is approximated using non-stationary regression. The use of non-stationary regression may be paired with a preconditioning step, such as illustrated in FIGS. 1-2 (see e.g., 130). Alternatively, non-stationary regression may be used without a preconditioning step, such as illustrated in FIG. 5. In this regard, in one implementation, a preconditioned gradient may be input to the inverse Hessian (which was approximated using non-stationary regression) in order to generate the search direction. Alternatively, an unconditioned gradient may be input to the inverse Hessian in order to generate the search direction.

Thus, the inversion as illustrated in FIGS. 1-2 or 5 may be performed for the entire image. Alternatively, the subsurface may be divided into sub-sections, and inversion performed on the respective sub-sections (e.g., 10 separate sub-sections). However, dividing the subsurface may result in discontinuities at the borders of the respective sub-sections when stitching the different sub-sections together. To reduce the issue of discontinuities between the different sub-sections, tapering may be performed.

Figure 6:
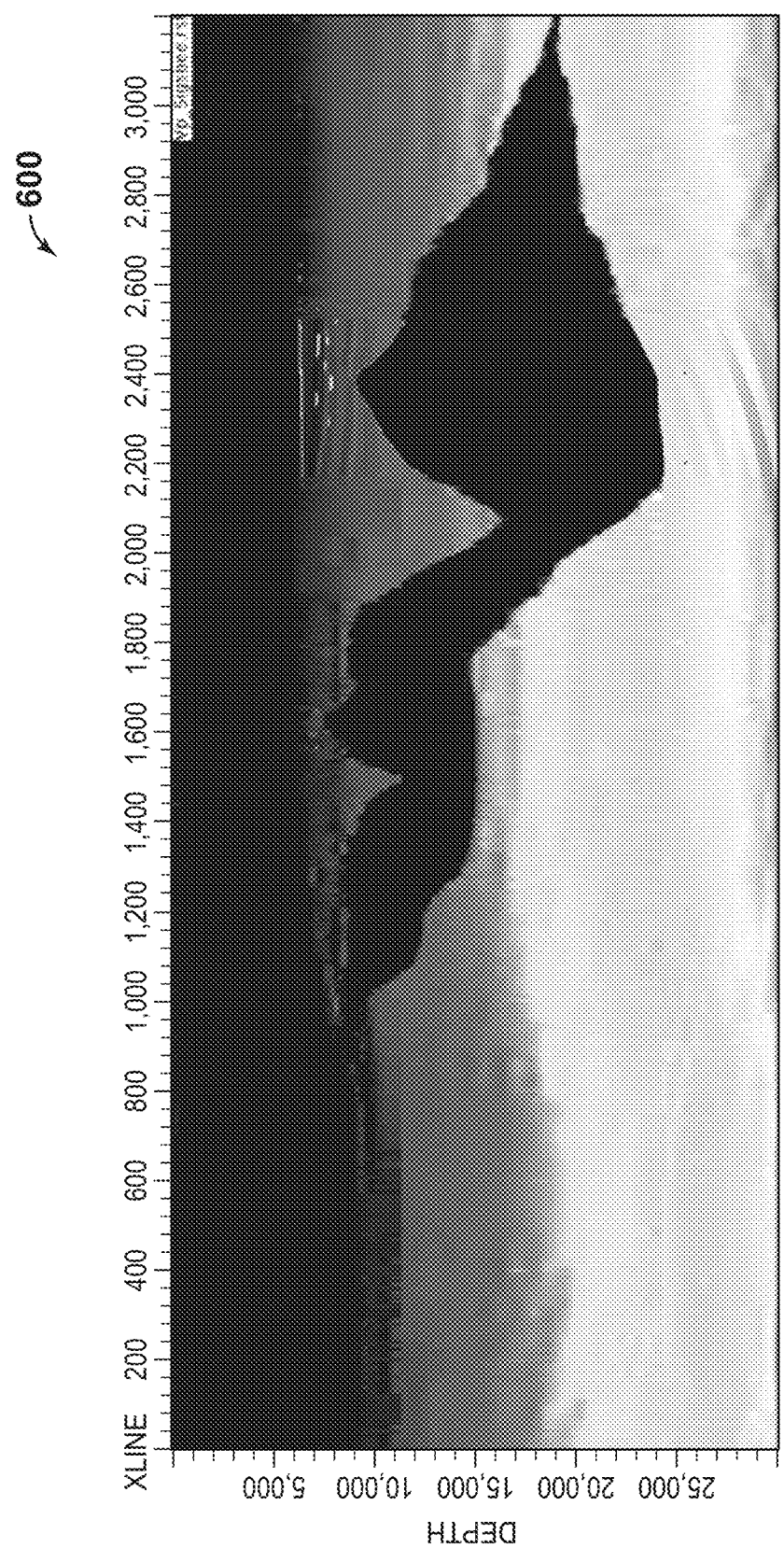
FIG. 6 is an illustration of a complex salt geometry, using a 2D model known as the Sigsbee velocity model.
Figure 7:
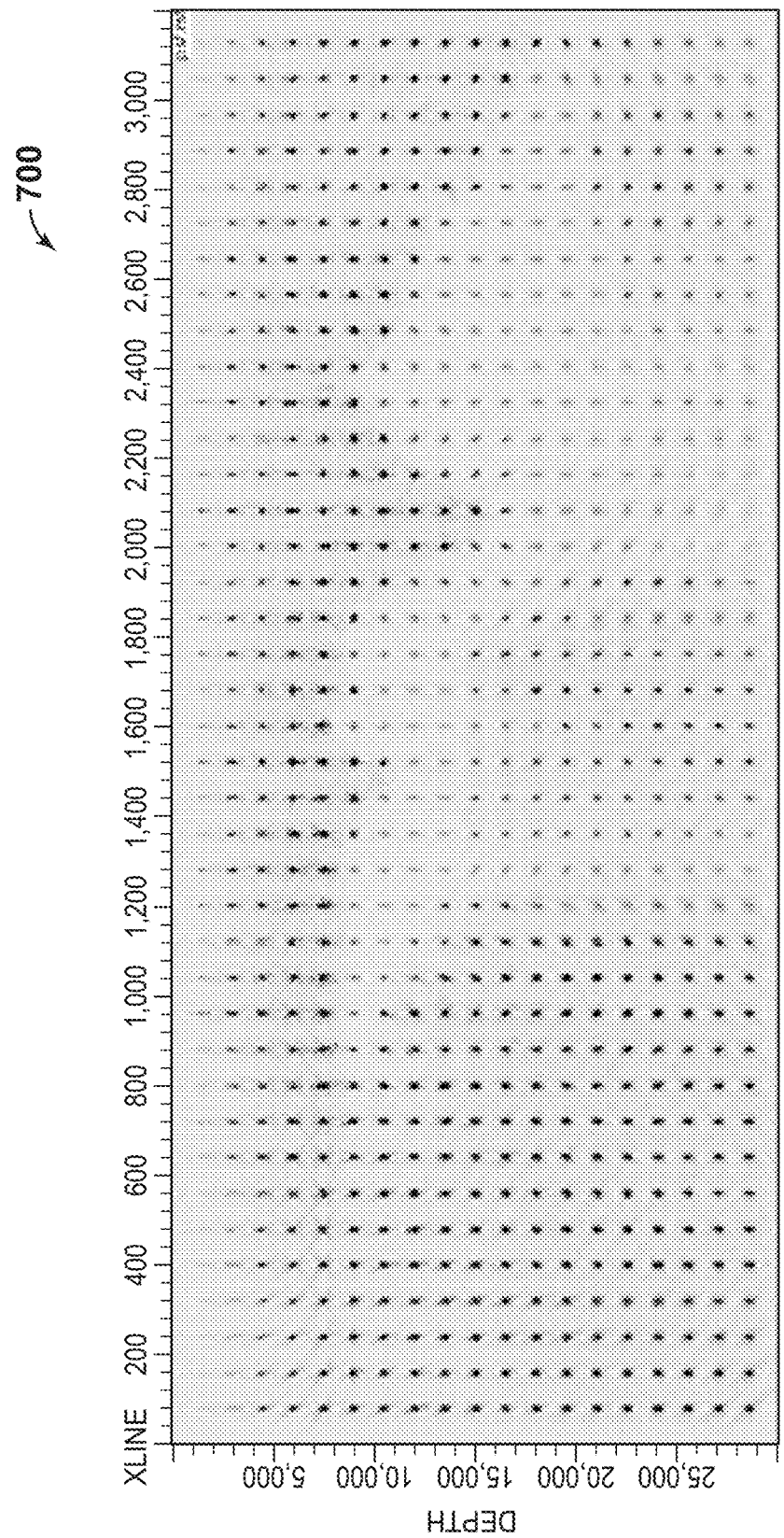
FIG. 7 is an illustration of the point-spread functions (PSFs) computed from the migration velocity model, which is a smoothed version of the blocky velocity model shown in FIG. 6.

FIG. 6 is an illustration 600 of a complex salt geometry, using a 2D model known as the Sigsbee velocity model (see http://www.delphi.tudelft.nl/SMAART/sigsbee2a.htm). The data which are used for seismic migration are synthetically generated. FIG. 7 is an illustration 700 of the point-spread functions (PSFs) computed from the migration velocity model, which is a smoothed version of the blocky velocity model shown in FIG. 6. The complexity of the salt geometry as well as the strong velocity contrast create wipe-out zones underneath the salt, as indicated in the PSF volume. FIGS. 8A-D compare the first iteration result of LS-RTM using T-power as a preconditioner (see illustration 800 in FIG. 8A), PSF as a preconditioner (see illustration 810 in FIG. 8B) and NMF as a preconditioner (see illustration 820 in FIG. 8C). The NMF coefficients are computed based on preconditioned gradients using PSFs. The LS-RTM result using NMF achieves significantly better illumination underneath the salt, and for well-illuminated regions, the amplitude has been fully recovered compared with the true zero-offset reflectivity model, as shown in the illustration 830 in FIG. 8D.

Figures 9A, 9B, 9C, 9D:
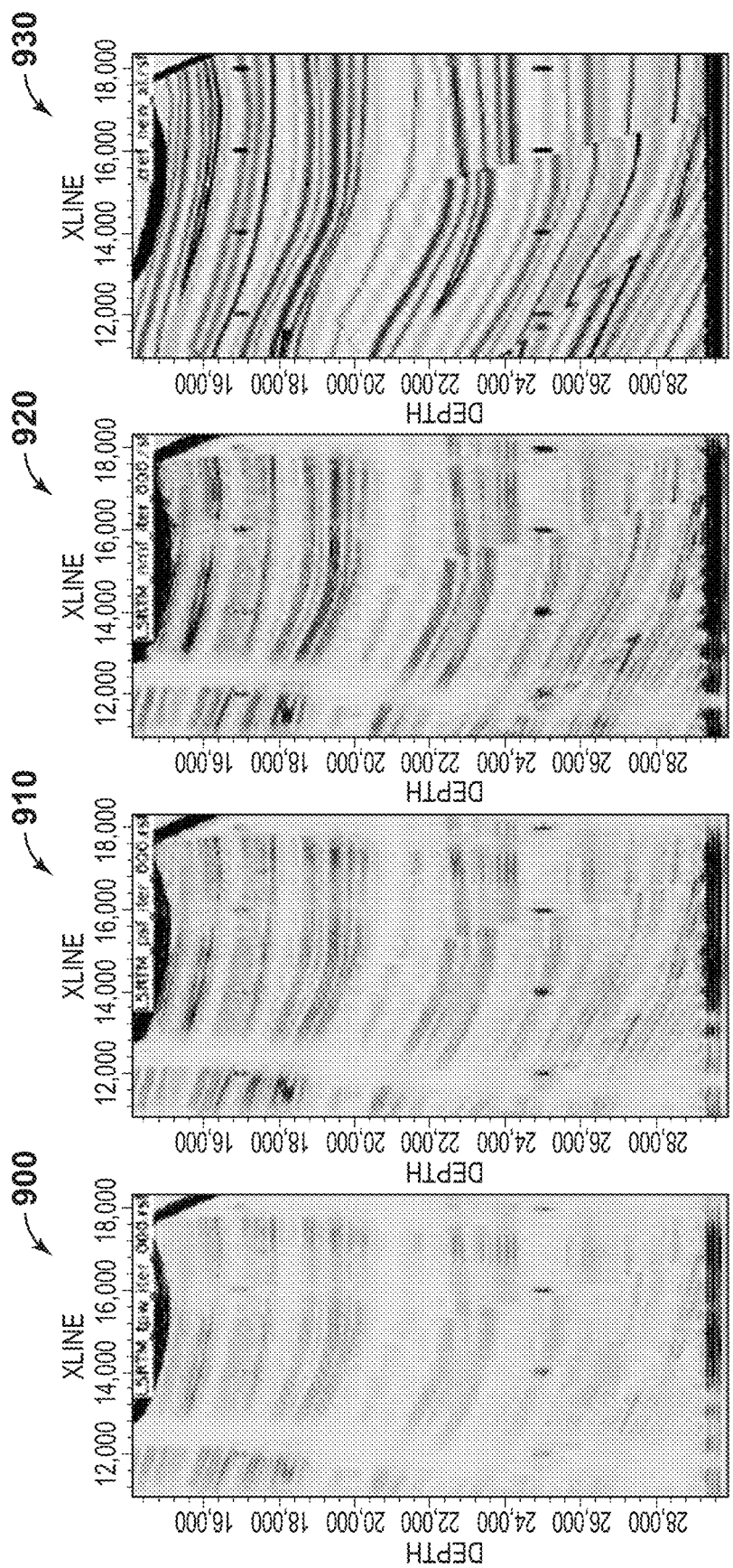
FIGS. 9A-D show a central portion of the Sigsbee image, with the LS-RTM image computed with T-power (FIG. 9A), the LS-RTM image computed with PSF (FIG. 9B), the LS-RTM image computed with NMF (FIG. 9C), and the true zero-offset reflectivity model (FIG. 9D).

To further illustrate the improvement in image quality, FIGS. 9A-D show a central portion of the Sigsbee image, which is directly underneath the salt body. The LS-RTM image computed with T-power, as indicated in the illustration 900 of FIG. 9A, shows blurred reflectors and weak seismic amplitudes compared with the LS-RTM image with PSF, as indicated in the illustration 910 of FIG. 9B. The NMF result, as indicated in the illustration 920 of FIG. 9C, further enhances the amplitude balancing compared with PSF, and its absolute amplitude approaches the true zero-offset reflectivity, as shown in the illustration 930 of FIG. 9D.

The examples illustrated in FIGS. 6-9D are directed to post-stack workflows, which comprises stacking common image gathers after pre-stack migration. Alternatively, the methodology disclosed herein may be used in the pre-stack domain, which comprises computing a preconditioning filter for each offset or angle bin prior to stacking. Further, various types of inversion are contemplated, such as linear inversion (e.g., least-squares inversion, such as disclosed in U.S. Pat. No. 9,482,770, incorporated by reference herein in its entirety) or non-linear inversion (e.g., full wavefield inversion, such as disclosed in U.S. Pat. No. 10,386,511, incorporated by reference herein in its entirety). In this regard, any discussion herein regarding inversion may be applied to either linear inversion or non-linear inversion.

Figure 10:
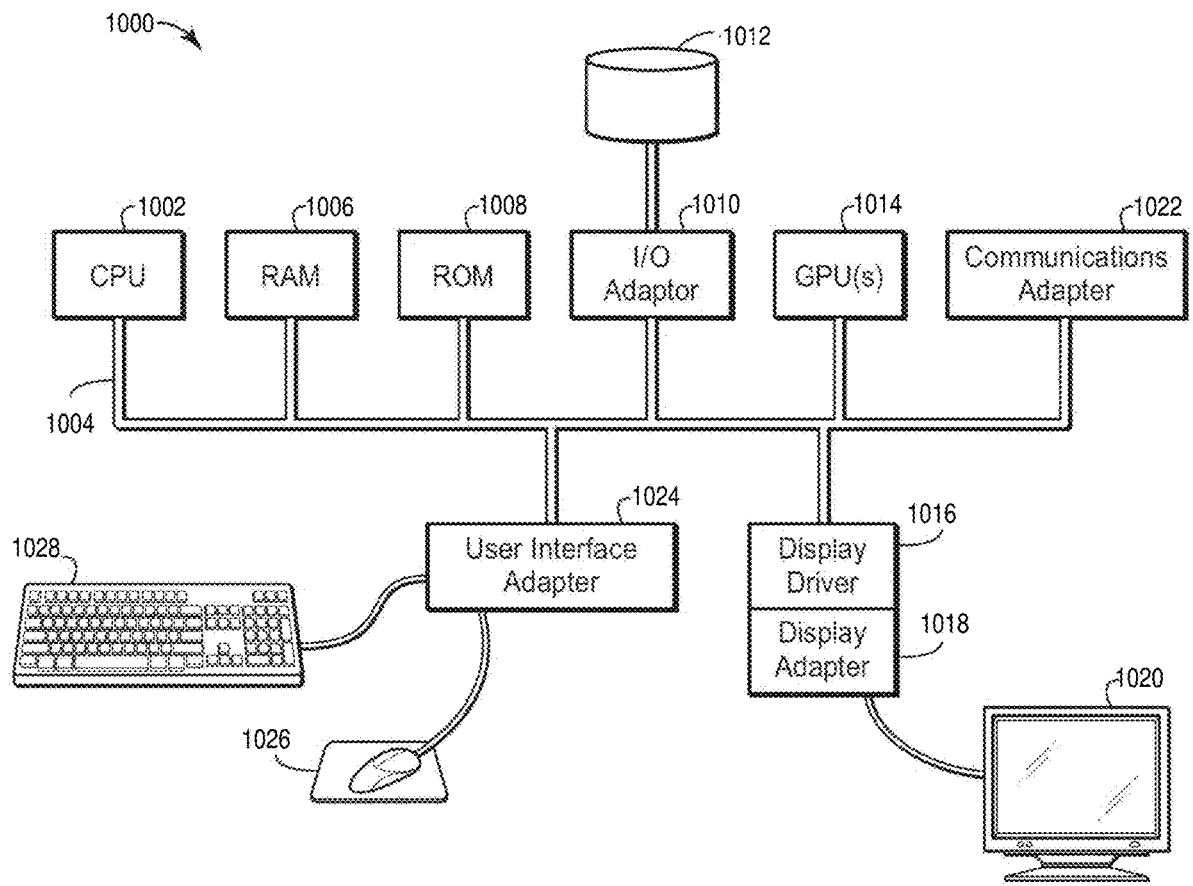
FIG. 10 is a diagram of an exemplary computer system that may be utilized to implement the methods described herein.

In all practical applications, the present technological advancement must be used in conjunction with a computer, programmed in accordance with the disclosures herein. For example, FIG. 10 is a diagram of an exemplary computer system 1000 that may be utilized to implement methods described herein. A central processing unit (CPU) 1002 is coupled to system bus 1004. The CPU 1002 may be any general-purpose CPU, although other types of architectures of CPU 1002 (or other components of exemplary computer system 1000) may be used as long as CPU 1002 (and other components of computer system 1000) supports the operations as described herein. Those of ordinary skill in the art will appreciate that, while only a single CPU 1002 is shown in FIG. 10, additional CPUs may be present. Moreover, the computer system 1000 may comprise a networked, multi-processor computer system that may include a hybrid parallel CPU/GPU system. The CPU 1002 may execute the various logical instructions according to various teachings disclosed herein. For example, the CPU 1002 may execute machine-level instructions for performing processing according to the operational flow described.

The computer system 1000 may also include computer components such as non-transitory, computer-readable media. Examples of computer-readable media include a random access memory (RAM) 1006, which may be SRAM, DRAM, SDRAM, or the like. The computer system 1000 may also include additional non-transitory, computer-readable media such as a read-only memory (ROM) 1008, which may be PROM, EPROM, EEPROM, or the like. RAM 1006 and ROM 1008 hold user and system data and programs, as is known in the art. The computer system 1000 may also include an input/output (I/O) adapter 1010, a graphics processing unit (GPU) 1014, a communications adapter 1022, a user interface adapter 1024, a display driver 1016, and a display adapter 1018.

The I/O adapter 1010 may connect additional non-transitory, computer-readable media such as storage device(s) 1012, including, for example, a hard drive, a compact disc (CD) drive, a floppy disk drive, a tape drive, and the like to computer system 1000. The storage device(s) may be used when RAM 1006 is insufficient for the memory requirements associated with storing data for operations of the present techniques. The data storage of the computer system 1000 may be used for storing information and/or other data used or generated as disclosed herein. For example, storage device(s) 1012 may be used to store configuration information or additional plug-ins in accordance with the present techniques. Further, user interface adapter 1024 couples user input devices, such as a keyboard 1028, a pointing device 1026 and/or output devices to the computer system 1000. The display adapter 1018 is driven by the CPU 1002 to control the display on a display device 1020 to, for example, present information to the user such as subsurface images generated according to methods described herein.

The architecture of computer system 1000 may be varied as desired. For example, any suitable processor-based device may be used, including without limitation personal computers, laptop computers, computer workstations, and multi-processor servers. Moreover, the present technological advancement may be implemented on application specific integrated circuits (ASICs) or very large scale integrated (VLSI) circuits. In fact, persons of ordinary skill in the art may use any number of suitable hardware structures capable of executing logical operations according to the present technological advancement. The term "processing circuit" encompasses a hardware processor (such as those found in the hardware devices noted above), ASICs, and VLSI circuits. Input data to the computer system 1000 may include various plug-ins and library files. Input data may additionally include configuration information.

Preferably, the computer is a high performance computer (HPC), known to those skilled in the art. Such high performance computers typically involve clusters of nodes, each node having multiple CPU's and computer memory that allow parallel computation. The models may be visualized and edited using any interactive visualization programs and associated hardware, such as monitors and projectors. The architecture of system may vary and may be composed of any number of suitable hardware structures capable of executing logical operations and displaying the output according to the present technological advancement. Those of ordinary skill in the art are aware of suitable supercomputers available from Cray or IBM.

It is intended that the foregoing detailed description be understood as an illustration of selected forms that the invention can take and not as a definition of the invention. It is only the following claims, including all equivalents, that are intended to define the scope of the claimed invention. Further, it should be noted that any aspect of any of the preferred embodiments described herein may be used alone or in combination with one another. Finally, persons skilled in the art will readily recognize that in preferred implementation, some or all of the steps in the disclosed method are performed using a computer so that the methodology is computer implemented. In such cases, the resulting physical properties model may be downloaded or saved to computer storage.

The following example embodiments of the invention are also disclosed:

Embodiment 1

An iterative method for inverting measured geophysical data in order to generate a subsurface property model of one or more physical properties, the method comprising:
- (a) computing, using at least one computer and a subsurface property model, an objective function measuring misfit between model-simulated data and the measured geophysical data;
- (b) computing, using the at least one computer, a gradient of the objective function with respect to parameters of the subsurface property model;
- (c) preconditioning, using the at least one computer, the gradient;
- (d) approximating, using non-stationary matching filters, an inverse Hessian of the subsurface property model;
- (e) computing a search direction using the inverse Hessian and the preconditioned gradient;
- (f) updating the subsurface property model using the search direction; and
- (g) analyzing the updated subsurface property model for convergence.

Embodiment 2

The method of embodiment 1:
wherein preconditioning comprises at least one of: T-power, source-illumination compensation or PSF deconvolution.

Embodiment 3

The method of any of embodiments 1 or 2:
wherein preconditioning comprises normalizing sensitivity across an entire subsurface property model.

Embodiment 4

The method of any of embodiments 1-3,
wherein preconditioning introduces errors; and
wherein using non-stationary matching filters reduces the errors.

Embodiment 5

The method of any of embodiments 1-4,
wherein preconditioning results in bandwidth broadening, regularization and illumination compensation; and
wherein using non-stationary matching filters further results in bandwidth broadening, regularization and illumination compensation for artifact removal and additional enhancement to preconditioned gradients.

Embodiment 6

The method of any of embodiments 1-5,
wherein using the non-stationary matching filters comprises regularized non-stationary regression.

Embodiment 7

The method of any of embodiments 1-6,
wherein steps (b)-(g) are iterated until the updated subsurface property model is converged within a predetermined criterion.

Embodiment 8

The method of any of embodiments 1-7,
wherein preconditioning comprises a non-sliding window approach; and
wherein using the non-stationary matching filters comprises using a sliding window.

Embodiment 9

The method of any of embodiments 1-8,
wherein approximating the inverse Hessian comprises:
taking a difference between the preconditioned gradients in two different iterations to generate a gradient change;
taking a difference between images in two different iterations to generate a model update;
estimating the inverse Hessian by matching the gradient change to the model update; and
applying estimated filters to the preconditioned gradients to correct for residual Hessian effects.

Embodiment 10

The method of any of embodiments 1-9,
further comprising:
dividing a subsurface into a plurality of at least partly overlapping volumes;
performing (a)-(e) on respective subsurface property models for each of the plurality of at least partly overlapping volumes; and
interpolating the respective surface property models.

Embodiment 11

The method of any of embodiments 1-10,
wherein inverting the measured geophysical data comprises linear inversion.

Embodiment 12

The method of any of embodiments 1-10,
wherein inverting the measured geophysical data comprises non-linear inversion.

Embodiment 13

The method of any of embodiments 1-12,
wherein steps (a)-(g) are performed in a post-stack domain.

Embodiment 14

The method of any of embodiments 1-12,
wherein steps (a)-(g) are performed in a pre-stack domain (e.g. offset or angle domain).

Embodiment 15

An iterative method for inverting measured geophysical data in order to generate a subsurface property model of one or more physical properties, the method comprising:
computing, using at least one computer and a subsurface property model, an objective function measuring misfit between model-simulated data and the measured geophysical data;
computing, using the at least one computer, a gradient of the objective function with respect to parameters of the subsurface property model;
approximating, using non-stationary matching filters with longer-scale features and the gradient, an inverse Hessian of the subsurface property model;
computing a search direction using the inverse Hessian and the gradient;
updating the subsurface property model using the search direction;
analyzing the updated subsurface property model for convergence; and
responsive to determining that the updated subsurface property model has not converged, iterating using non-stationary matching filters with progressively finer-scale features.

Embodiment 16

The method of embodiment 15,
wherein the subsurface property model has a number of subsurface locations;
wherein the non-stationary matching filters with the longer-scale features has a number of filters at least one order less than the number of the subsurface locations; and
wherein the non-stationary matching filters with the finer-scale features has a number of filters greater than the at least one order less than the number of the subsurface locations.

Embodiment 17

The method of any of embodiments 15 or 16,
wherein interpolation on the non-stationary matching filters with the longer-scale features is performed in order to generate the non-stationary matching filters with the finer-scale features.

Embodiment 18

The method of any of embodiments 15-17,
wherein the inverse Hessian is initially approximated using the non-stationary matching filters with scale features greater than 1; and
wherein the inverse Hessian is thereafter approximated using the non-stationary matching filters with scale features of 1.

Embodiment 19

The method of any of embodiments 15-18,
wherein an initial scale for initially approximating the inverse Hessian is predetermined; and
wherein a reduction in scale between iterations is predetermined.

Embodiment 20

The method of any of embodiments 15-19,
wherein the non-stationary matching filters with longer-scale features are at defined spatial locations separated by a first predetermined scale of at least every tenth location in 3D space; and
wherein the non-stationary matching filters with the finer-scale features are at defined spatial locations separated by a second predetermined scale of less than every tenth location in 3D space.

Embodiment 21

A non-transitory computer readable medium having stored thereon software instructions that, when executed by a processor, cause the processor to perform the method of any of embodiments 1-14.

Embodiment 22

A non-transitory computer readable medium having stored thereon software instructions that, when executed by a processor, cause the processor to perform the method of any of embodiments 15-20.

Embodiment 23

A system comprising a processor and a memory, the processor in communication with the memory, the memory having stored thereon software instructions that, when executed by the processor, cause the processor to perform the method of any of embodiments 1-14.

Embodiment 24

A system comprising a processor and a memory, the processor in communication with the memory, the memory having stored thereon software instructions that, when executed by the processor, cause the processor to perform the method of any of embodiments 15-20.

REFERENCES

The following references are hereby incorporated by reference herein in their entirety:

Aoki, N., & Schuster, G. T., Fast least-squares migration with a deblurring filter, Geophysics, 74(6), WCA83-WCA93 (2009).

Fletcher, R. P., Nichols, D., Bloor, R., & Coates, R. T., Least-squares migration-Data domain versus image domain using point spread functions, The Leading Edge, 35(2), 157-162 (2016).

Fomel, S., Shaping regularization in geophysical-estimation problems, Geophysics, 72(2), R29-R36 (2007).

Fomel, S., Adaptive multiple subtraction using regularized nonstationary regression, Geophysics, 74(1), V25-V33 (2009).

Guitton, A., Amplitude and kinematic corrections of migrated images for nonunitary imaging operators, Geophysics, 69(4), 1017-1024 (2004).

Guitton, A., Fast 3D least-squares RTM by preconditioning with nonstationary matching filters, In SEG Technical Program Expanded Abstracts 2017: pp. 4395-4399 (2017).

Rickett, J. E., Illumination-based normalization for wave-equation depth migration, Geophysics, 68(4), 1371-1379 (2003).

Symes, W. W., Approximate linearized inversion by optimal scaling of prestack depth migration, Geophysics, 73(2), R23-R35 (2008).

Tarantola, A., Inverse problem theory and methods for model parameter estimation, (Vol. 89), SIAM (2005).

Wang, P., Gomes, A., Zhang, Z., & Wang, M., Least-squares RTM: Reality and possibilities for subsalt imaging, In SEG Technical Program Expanded Abstracts 2016: pp. 4204-4209 (2016).

Wang, M., Huang, S., & Wang, P., Improved iterative least-squares migration using curvelet-domain Hessian filters, In SEG Technical Program Expanded Abstracts 2017: pp. 4555-4560 (2017).

The invention claimed is:

1. A method of hydrocarbon prospecting that employs iteratively inverting measured geophysical data in order to generate a subsurface property model of one or more physical properties, the method comprising:
   (a) computing, using a subsurface property model, an objective function measuring misfit between model-simulated data and the measured geophysical data;
   (b) computing a gradient of the objective function with respect to parameters of the subsurface property model;
   (c) preconditioning the gradient;
   (d) approximating, using non-stationary matching filters, an inverse Hessian of the subsurface property model;
   (e) computing a search direction using the inverse Hessian and the preconditioned gradient;
   (f) updating the subsurface property model using the search direction;
   (g) analyzing the updated subsurface property model for convergence; and
   (h) identifying potential hydrocarbon-bearing formations in a subsurface region with data from the updated subsurface property model.

2. The method of claim 1, wherein preconditioning comprises at least one of: T-power, source-illumination compensation, or point-spread function (PSF) deconvolution.

3. The method of claim 1, wherein preconditioning comprises normalizing sensitivity across an entire subsurface property model.

4. The method of claim 1, wherein preconditioning introduces errors; and
   wherein using non-stationary matching filters reduces the errors.

5. The method of claim 1, wherein preconditioning results in bandwidth broadening, regularization and illumination compensation; and wherein using non-stationary matching filters further results in bandwidth broadening, regularization and illumination compensation for artifact removal and additional enhancement to preconditioned gradients.

6. The method of claim 1, wherein using the non-stationary matching filters comprises regularized non-stationary regression.

7. The method of claim 1, wherein steps (b)-(g) are iterated until the updated subsurface property model is converged within a predetermined criterion.

8. The method of claim 1, wherein preconditioning comprises a non-sliding window approach; and wherein using the non-stationary matching filters comprises using a sliding window.

9. The method of claim 1, wherein approximating the inverse Hessian comprises:

taking a difference between the preconditioned gradient in two different iterations to generate a gradient change;

taking a difference between images in two different iterations to generate an image difference;

estimating the inverse Hessian by matching the gradient change to the image difference; and applying estimated filters to the preconditioned gradient to correct for residual Hessian effects.

10. The method of claim 1, further comprising:

dividing a subsurface into a plurality of at least partly overlapping volumes;

performing (a)-(e) on respective subsurface property models for each of the plurality of at least partly overlapping volumes; and interpolating the respective surface property models.

11. The method of claim 1, wherein inverting the measured geophysical data comprises linear inversion.

12. The method of claim 1, wherein inverting the measured geophysical data comprises non-linear inversion.

13. The method of claim 1, wherein steps (a)-(g) are performed in a post-stack domain.

14. The method of claim 1, wherein steps (a)-(g) are performed in a pre-stack domain comprising at least one of an offset or angle domain.

15. A method of hydrocarbon prospecting that employs iteratively inverting measured geophysical data in order to generate a subsurface property model of one or more physical properties, the method comprising:

computing, using a subsurface property model, an objective function measuring misfit between model-simulated data and the measured geophysical data;

computing a gradient of the objective function with respect to parameters of the subsurface property model;

approximating, using non-stationary matching filters and the gradient, an inverse Hessian of the subsurface property model;

computing a search direction using the inverse Hessian and the gradient;

updating the subsurface property model using the search direction;

analyzing the updated subsurface property model for convergence;

upon determining that the updated subsurface property model has not converged, iterating using non-stationary matching filters having different scale features that have progressively finer resolution in each iteration; and upon determining that the updated subsurface property model has converged, identifying potential hydrocarbon-bearing formations in a subsurface region with data from the updated subsurface property model.

16. The method of claim 15, wherein the subsurface property model has a number of subsurface locations; and wherein the non-stationary matching filters having different scale features that have progressively finer resolution have a number of filters greater than the at least one order less than the number of the subsurface locations.

17. The method of claim 16, wherein interpolation on the non-stationary matching filters is performed in order to generate the non-stationary matching filters with the finer-scale features.

18. The method of claim 17, wherein the inverse Hessian is initially approximated using the non-stationary matching filters with scale features greater than 1; and wherein the inverse Hessian is thereafter approximated using the non-stationary matching filters with scale features of 1.

19. The method of claim 17, wherein an initial scale for initially approximating the inverse Hessian is predetermined; and wherein a reduction in scale between iterations is predetermined.

20. The method of claim 17, wherein the non-stationary matching filters having different scale features that have progressively finer resolution in each iteration are at defined spatial locations separated by a predetermined scale of less than every tenth location in 3D space.

* * * * *